United States Patent
Colehour

(10) Patent No.: US 11,852,378 B2
(45) Date of Patent: Dec. 26, 2023

(54) CONVECTION FAN COVER

(71) Applicants: BSH Home Appliances Corporation, Irvine, CA (US); BSH Hausgeräte GmbH, Munich (DE)

(72) Inventor: Robert Colehour, Knoxville, TN (US)

(73) Assignees: BSH Home Appliances Corporation, Irvine, CA (US); BSR Hausgeräte GmbH, Munich (DE)

( * ) Notice: Subject to any disclaimer, the term of this patent is extended or adjusted under 35 U.S.C. 154(b) by 1201 days.

(21) Appl. No.: 16/221,645

(22) Filed: Dec. 17, 2018

(65) Prior Publication Data

US 2020/0191434 A1    Jun. 18, 2020

(51) Int. Cl.
- *F24H 3/04* (2022.01)
- *F04D 25/12* (2006.01)
- *H05K 7/20* (2006.01)

(52) U.S. Cl.
CPC ............ *F24H 3/0411* (2013.01); *F04D 25/12* (2013.01); *F24F 2221/34* (2013.01); *H05K 7/20172* (2013.01)

(58) Field of Classification Search
None
See application file for complete search history.

(56) References Cited

U.S. PATENT DOCUMENTS

| | | | |
|---|---|---|---|
| 3,528,399 A * | 9/1970 | Perl | F24C 14/025 126/21 A |
| 3,529,582 A * | 9/1970 | Hurko | F24C 15/325 126/21 R |
| 3,587,557 A * | 6/1971 | Henderson et al. | F28D 21/0003 126/21 A |
| 3,827,346 A * | 8/1974 | Tropp | F24C 15/322 99/446 |
| 4,332,992 A * | 6/1982 | Larsen | H05B 6/6435 126/21 A |
| 4,395,233 A * | 7/1983 | Smith | F26B 21/02 126/21 A |
| 4,598,689 A * | 7/1986 | Eke | H05B 6/6411 126/21 A |
| 4,771,163 A | 9/1988 | Thiboutot | |
| 4,831,225 A * | 5/1989 | Ishifuro | H05B 6/6482 219/681 |
| 4,831,238 A * | 5/1989 | Smith | A21B 1/245 126/21 A |
| 4,839,486 A * | 6/1989 | Tanigawa | H05B 6/642 219/681 |

(Continued)

FOREIGN PATENT DOCUMENTS

| | | |
|---|---|---|
| JO | H09152131 A | 6/1997 |
| JP | 2006292189 A | 10/2006 |
| WO | 2005089557 A1 | 9/2005 |

*Primary Examiner* — Thor S Campbell
(74) *Attorney, Agent, or Firm* — Michael E. Tschupp; Andre Pallapies; Brandon G. Braun

(57) ABSTRACT

An improved convection fan cover is provided. In one or more implementations, the improved convection fan cover has a shutter system. As the convection heating system operates, the shutter system opens and closes (or blocks and unblocks) vents in the convection fan cover, creating an oscillation effect that alters the flow of air throughout an oven cavity, contributing to a more even cooking profile.

19 Claims, 3 Drawing Sheets

(56) References Cited

U.S. PATENT DOCUMENTS

| | | | | |
|---|---|---|---|---|
| 4,865,864 | A * | 9/1989 | Rijswijck | A47J 37/047 426/520 |
| 4,867,132 | A * | 9/1989 | Yencha | F24C 15/322 126/21 A |
| 5,121,737 | A * | 6/1992 | Yencha, III | F24C 15/322 126/21 A |
| 5,222,474 | A * | 6/1993 | Yencha, III | F24C 15/322 126/21 A |
| 5,485,780 | A * | 1/1996 | Koether | F24C 15/006 219/400 |
| 5,584,233 | A | 12/1996 | Glucksman et al. | |
| 5,676,044 | A * | 10/1997 | Lara, Jr. | A21B 1/245 126/21 A |
| 6,116,895 | A * | 9/2000 | Onuschak | F26B 13/10 432/120 |
| 6,280,317 | B1 | 8/2001 | Przilas et al. | |
| 6,727,478 | B2 | 8/2004 | Rael et al. | |
| 6,878,915 | B1 * | 4/2005 | Hern-Fonseth | F24C 15/2007 126/21 A |
| 6,880,544 | B2 | 4/2005 | Hegge et al. | |
| D524,600 | S * | 7/2006 | Austin | 219/400 |
| 7,128,526 | B2 | 10/2006 | Paulsen | |
| 7,371,999 | B1 | 5/2008 | Douglas et al. | |
| 7,411,160 | B2 * | 8/2008 | Duncan | F24C 15/325 126/21 A |
| 8,106,334 | B2 * | 1/2012 | Nam | F24C 15/322 219/400 |
| 8,800,542 | B1 | 8/2014 | Kennington | |
| 9,103,104 | B1 | 8/2015 | Tom | |
| 10,595,540 | B1 * | 3/2020 | Knight | A23B 4/0523 |
| 10,863,592 | B2 * | 12/2020 | Kim | H05B 6/6423 |
| 2003/0024925 | A1 * | 2/2003 | Graves | H05B 6/6485 219/681 |
| 2003/0172919 | A1 * | 9/2003 | Rabas | F24C 15/322 126/21 A |
| 2005/0061795 | A1 * | 3/2005 | Paller | A21B 1/26 219/400 |
| 2008/0168977 | A1 | 7/2008 | Daud | |
| 2012/0294992 | A1 * | 11/2012 | Sager | F24C 7/08 426/231 |
| 2013/0008426 | A1 * | 1/2013 | Newsom | F24C 15/325 126/21 A |
| 2013/0255655 | A1 * | 10/2013 | Johnson | F24C 15/2007 126/15 A |
| 2013/0284161 | A1 * | 10/2013 | Johnson | F24C 15/325 126/21 A |
| 2013/0291854 | A1 * | 11/2013 | Johnson | F24C 15/16 126/21 A |
| 2015/0059595 | A1 * | 3/2015 | Rand | F24C 7/085 99/468 |
| 2015/0330640 | A1 * | 11/2015 | Stork genannt Wersborg | G01N 33/02 99/332 |
| 2019/0003721 | A1 * | 1/2019 | Jang | F24C 7/082 |
| 2020/0053842 | A1 * | 2/2020 | Jeon | A47J 37/0641 |
| 2020/0072475 | A1 * | 3/2020 | Crow | F24C 15/322 |

* cited by examiner

CONVECTION FAN COVER

FIELD OF TECHNOLOGY

The present technology relates to improvements for fans in home appliances, in particular, for convection fans in cooking appliances (e.g., microwaves, ranges, ovens, etc.).

BACKGROUND

Traditional convection ovens use a fan to circulate air inside the oven cavity. To protect the internals of the convection fan, a fan cover can be used.

However, these fan covers are typically simple and have no function other than protecting the convection fan.

Accordingly, what is needed is a way to increase the functionality of a convection fan cover while increasing the benefits a convection fan provides.

BRIEF SUMMARY

The present invention is directed to an improved convection fan cover. These improvements include increased functionality and performance for a convection cooking system.

Used in conjunction with a convection heating system having a heating element for heating air and a fan to blow heated air into the cooking cavity of an oven, the convection fan cover has a series of openings to allow heated air to be blown into the cooking cavity while providing protection for the components of the convection heating system.

The convection fan cover also has an oscillation system that operates in conjunction with the convection heating system. The oscillation system uses an actuator to manipulate a series of shutters that periodically block air flow through openings in the fan cover.

These improvements allow for a convection fan cover that provides the protective benefits of traditional fan covers while increasing the functionality and performance for a convection cooking system.

Various other objects, features, aspects, and advantages of the present invention will become more apparent to those skilled in the art upon review of the following detailed description of preferred embodiments of the invention and accompanying drawings in which like numerals represent like components.

DETAILED DESCRIPTION

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Throughout this disclosure, the terms top, bottom, front, back, left and right may be used. These terms are only intended to provide relational orientation with respect to one another. For example, any two opposed sides can be a right side and a left side and by changing to an opposed viewpoint, right versus left will be changed. Thus, top, bottom, front, back, left and right should not be considered limiting and are used only to distinguish their relationship to one another.

Figure 1:
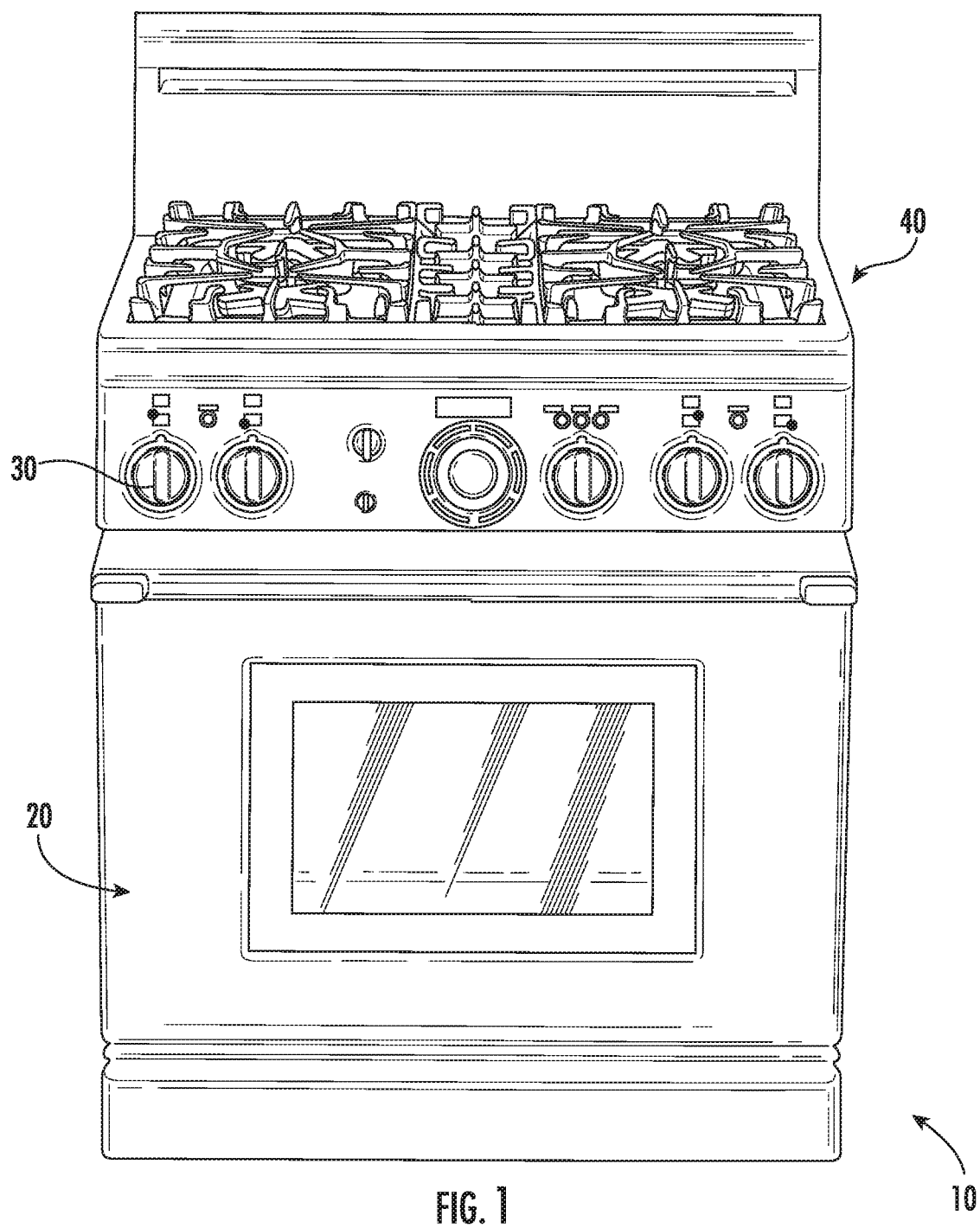
FIG. 1 is a perspective, external view of a convection oven.

FIG. 1 depicts a standard convection range having both a cooktop and an oven. The range (10) has an oven door (20) that opens to access an oven cavity where foodstuffs can be inserted and cooked. The oven has a standard control system (30) for manipulating the cooking systems. As depicted, the cooktop (40) has a series of gas burners. While the depicted range has an oven cavity and cooktop that uses provides heat via gas (e.g., propane or other natural gas) alternative embodiments may have heating elements powered by electricity or other means.

Figure 2:
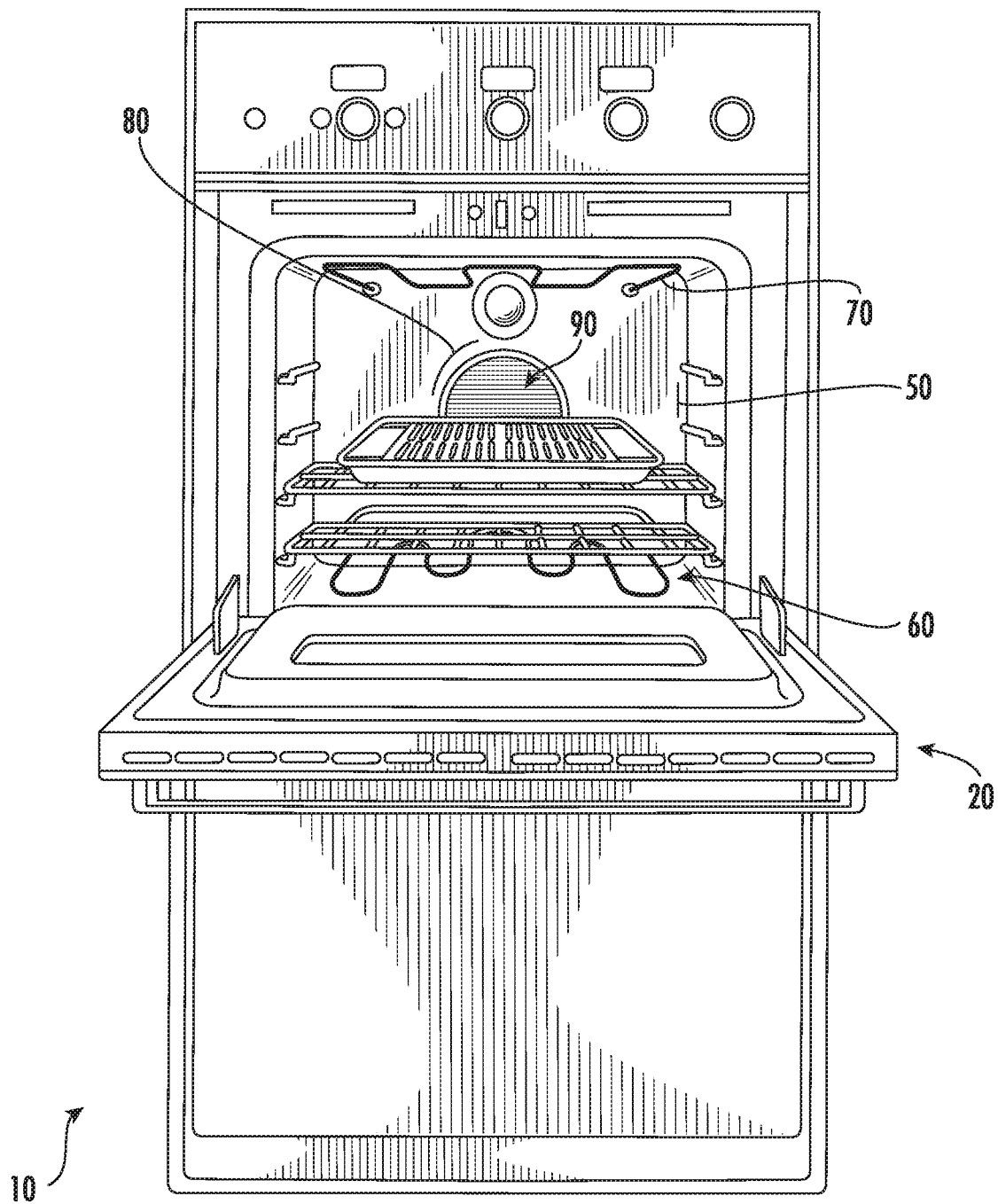
FIG. 2 is a perspective view of the oven cavity of a convection cavity

FIG. 2 depicts the oven cavity (50) of a standard convection range. The standard convection range has a bottom burner (60), a top/broil burner (70), and a convection heating system (80) disposed along the rear wall of the oven cavity. The convection heating system is located adjacent to an opening in the rear wall, behind or through which is positioned the fan of the convection heating system. The fan and/or opening in the rear wall is covered by a traditional convection fan cover (90).

The convection heating system is traditionally mounted to the oven body, and has a heating element (either gas or electric) for heating air pulled into the convection heating system from a source (typically fresh air from outside the oven body, or previously heated air from inside the oven cavity), and a fan to blow the heated air into the oven cavity through the opening in the rear wall of the oven cavity.

The purpose of the traditional convection fan cover is to protect the fan blades and internals of the convection heating system from coming into contact with contents placed in the oven cavity. Additionally, the traditional convection fan cover has several slots that allow air-flow to pass from the convection fan system into the oven cavity to cook foodstuffs placed within the cavity.

Currently, traditional convection fan covers have fixed inlets and outlets for directing air flow in a static manner. In contrast, FIG. 3 illustrates an improved convection fan cover (100) in accordance with embodiments of this invention that provides the benefits of traditional convection fan covers while allowing air outlets to be blocked and opened, resulting in a dynamic air flow in the oven cavity.

Figure 3:
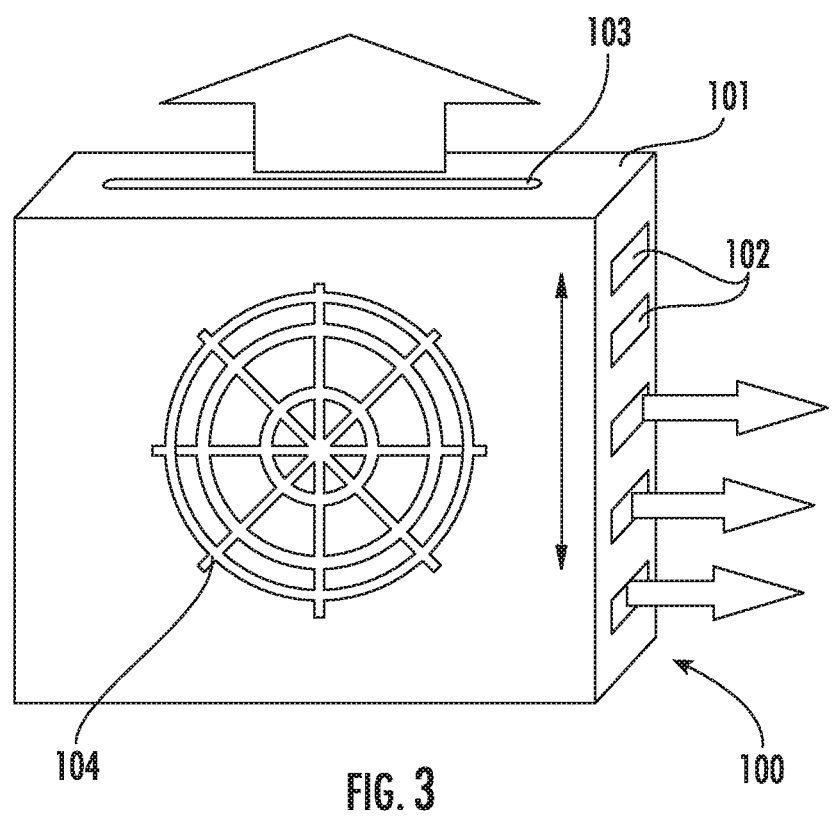
FIG. 3 is a perspective view of an improved convection fan cover.

The improved convection fan cover (100) depicted in FIG. 3 has a plurality of vents to allow air to flow through the improved cover, and an actuator that manipulates a shutter system to periodically block one or more vents during operation of the convection heating system. As a result, this results in a disruption in air movement as air is stopped on any of the four sides of the improved cover, creating an oscillating airflow direction system which can result in a more even cooking profile for foods cooked in the oven cavity.

The improved convection fan cover has a housing (101) with a square shape, and a top cover (104). Alternative embodiments allow for alternative shapes, including a pass-through vent (103) and a series of shutter vents (102).

Inside the improved convection fan cover is an actuator (not shown) which manipulates a shutter system (not shown). This shutter system periodically opens and closes one or more of the shutter vents in accordance with or in response to a pre-determined heating profile, temperature detection, or algorithmic determination. While in the preferred embodiment, the top cover and pass-through vent allow for constant, unblocked air flow, alternative embodiments allow for the top cover and pass-through vents to be blocked by the same shutter system as used to block the shutter.

In regards to blocking, in the preferred embodiment the shutter system can open and/or close the vents themselves, while in alternative embodiments the shutter system can manipulate a blocking window to block air flow through the respective vent.

While the convection heating system is operating, warm air is blown into the housing of the improved convection fan cover. Warm air can exit the convection fan cover through the top cover (104), the pass-through vent (103), or an unblocked vent (102). During operation the unblocked vents change to blocked vents, changing the flow of warm air into the oven cavity. While in the preferred embodiment there is a combination of air flow flowing through vents that can be manipulated and vents that are left open, alternative embodiments allow for all vents to be manipulated.

Generally, the combined features of the improved convection fan cover result in a rotating airflow direction system which creates an even cooking profile.

While any oven-suitable material can be used in constructing the improved convection fan cover, materials suitable for high-temperature use are preferred, particularly materials that can sustain pyrolytic cleaning. Furthermore, the non-powered nature of the invention reduces costs necessary to insulate sensitive electronic components from damage during pyrolytic cleaning.

The present invention has been described herein in terms of several preferred embodiments. However, modifications and additions to these embodiments will become apparent to those of ordinary skill in the art upon a reading of the foregoing description. It is intended that all such modifications and additions comprise a part of the present invention to the extent that they fall within the scope of the several claims appended hereto.

What is claimed is:

1. A convection oven, the convection oven comprising:
   an oven body, the oven body defining a cooking cavity having at least one wall with an opening;
   a convection heating system mounted to the oven body, the convection heating system having:
   a heating element for heating air, and
   a fan to blow the heated air into the cooking cavity through the opening;
   a convection fan cover attached to the opening, the convection fan cover having a plurality of openings to allow heated air to move into the cooking cavity; and
   a shutter system attached to the convection fan cover, the shutter system manipulating air flow through at least one of the plurality of openings at alternating intervals.

2. The convection oven of claim 1, wherein the blocking of at least one of the plurality of openings modifies the movement of air through the convection fan cover and into the cooking cavity.

3. The convection oven of claim 1, wherein the plurality of openings comprise a series of uniform vents spaced at regular intervals.

4. The convection oven of claim 3, wherein the series of uniform vents can be opened and/or closed.

5. The convection oven of claim 4, wherein the shutter system manipulates air flow through the series of uniform vents by opening and/or closing one or more vents.

6. The convection oven of claim 3, wherein the shutter system manipulates air flow through the series of uniform vents by blocking and/or unblocking one or more vents.

7. The convection oven of claim 1, wherein the shutter system manipulates air flow in response to changes in temperature in the cooking cavity.

8. The convection oven of claim 1, wherein the shutter system manipulates air flow in response to pre-determined heating profiles.

9. A convection fan cover, the convection fan cover comprising:
   a housing, the housing having a plurality of openings to allow for the movement of air out of the housing; and
   a shutter system disposed inside the housing, the shutter system blocking at least one of the plurality of openings at alternating intervals to modify the movement of air out of the housing.

10. The convection fan cover of claim 9, wherein the plurality of openings comprise a series of uniform vents spaced at regular intervals.

11. The convection fan cover of claim 10, wherein the series of uniform vents can be opened and/or closed.

12. The convection fan cover of claim 11, wherein the shutter system manipulates air flow through the series of uniform vents by opening and/or closing one or more vents.

13. The convection fan cover of claim 9, wherein the shutter system manipulates air flow in response to changes in temperature in the cooking cavity.

14. The convection fan cover of claim 13, wherein the shutter system manipulates air flow in response to pre-determined heating profiles.

15. The convection oven of claim 1, wherein the shutter system periodically manipulates the air flow through the at least one of the plurality of openings to create a rotating airflow in the cooking cavity.

16. The convection oven of claim 1, wherein the convection fan cover includes a plurality of sides and a top cover, and
   wherein the plurality of openings are formed on at least one of the plurality of sides of the convection fan cover.

17. The convection oven of claim 16, wherein the convection fan cover includes four sides and the top cover.

18. The convection fan cover of claim 9, wherein the housing includes a plurality of sides and a top cover, and
   wherein the plurality of openings are formed on at least one of the plurality of sides of the housing.

19. The convection fan cover of claim 18, wherein the housing includes four sides and the top cover.

* * * * *